United States Patent
Moon et al.

(10) Patent No.: US 10,202,680 B2
(45) Date of Patent: Feb. 12, 2019

(54) APPARATUS FOR MANUFACTURING DISPLAY APPARATUS

(71) Applicant: SAMSUNG DISPLAY CO., LTD., Yongin, Gyeonggi-Do (KR)

(72) Inventors: Byungrok Moon, Yongin (KR); Kwonhyuk Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 281 days.

(21) Appl. No.: 14/590,329

(22) Filed: Jan. 6, 2015

(65) Prior Publication Data

US 2016/0030959 A1  Feb. 4, 2016

(30) Foreign Application Priority Data

Aug. 4, 2014  (KR) .................. 10-2014-0099971

(51) Int. Cl.
| | |
|---|---|
| *B05B 1/06* | (2006.01) |
| *B05B 17/06* | (2006.01) |
| *C23C 14/12* | (2006.01) |
| *H01L 51/56* | (2006.01) |

(52) U.S. Cl.
CPC .............. *C23C 14/12* (2013.01); *B05B 1/06* (2013.01); *B05B 17/0607* (2013.01); *H01L 51/56* (2013.01)

(58) Field of Classification Search
CPC  H01L 51/56; C23C 14/12; B05B 1/00; B05B 1/06; B05B 1/0607; B05B 1/0623; B05B 1/063; B05B 1/0653
USPC .................. 239/132, 133, 102.1, 102.2, 589
See application file for complete search history.

(56) References Cited

U.S. PATENT DOCUMENTS

| | | | | |
|---|---|---|---|---|
| 4,978,067 A | * | 12/1990 | Berger | ............... B05B 17/0623 239/102.2 |
| 5,110,286 A | * | 5/1992 | Gaysert | ................... F23D 11/44 239/102.2 |
| 9,565,870 B2 | * | 2/2017 | Deo | ...................... B05B 17/063 |
| 2001/0032887 A1 | * | 10/2001 | Everett | ................... G01F 11/44 239/1 |
| 2004/0043138 A1 | * | 3/2004 | Jagannathan | ....... H01L 51/0003 427/66 |
| 2007/0051835 A1 | * | 3/2007 | Yasui | ................... B05B 7/0012 239/590 |

(Continued)

FOREIGN PATENT DOCUMENTS

| | | |
|---|---|---|
| JP | 2011-228228 A | 11/2011 |
| KR | 10-2006-0067402 A | 6/2006 |

(Continued)

*Primary Examiner* — Jason J Boeckmann
(74) *Attorney, Agent, or Firm* — Lee & Morse P.C.

(57) ABSTRACT

An apparatus for manufacturing a display apparatus, the apparatus including an organic material supply unit; a bagging pump unit that is connected to the organic material supply unit such that the organic material supply unit supplies an organic material to the bagging pump unit; an organic material adjusting unit that is connected to the bagging pump unit such that the bagging pump unit selectively supplies the organic material to the organic material adjusting unit; and a nozzle unit that is connected to the organic material adjusting unit such that the organic material adjusting unit adjusts an amount of the organic material provided to the nozzle unit, the nozzle unit changing the organic material into particles and spraying the particles.

20 Claims, 6 Drawing Sheets

(56) References Cited

U.S. PATENT DOCUMENTS

2007/0176017 A1\* 8/2007 Berger .................. B05B 17/063
                                                                                   239/102.2
2010/0007483 A1 1/2010 Oh et al.

FOREIGN PATENT DOCUMENTS

| KR | 10-0936378 B1 | 1/2010 |
| KR | 10-2014-0026102 A | 3/2014 |
| WO | WO 2010/126254 A2 | 11/2010 |

\* cited by examiner

APPARATUS FOR MANUFACTURING DISPLAY APPARATUS

CROSS-REFERENCE TO RELATED APPLICATION

Korean Patent Application No. 10-2014-0099971, filed on Aug. 4, 2014, in the Korean Intellectual Property Office, and entitled: "Apparatus for Manufacturing Display Apparatus," is incorporated by reference herein in its entirety.

BACKGROUND

1. Field

Embodiments relate to an apparatus for manufacturing a display apparatus.

2. Description of the Related Art

Use of portable electronic devices has remarkably increased. Examples of portable electronic devices may include small electronic devices such as mobile phones and tablet PCs.

Such portable electronic devices may include display panels to provide visual information, e.g., images, to users and to support various functions. Due to the reduction in the sizes of components for driving display panels, the display panels have become more important in electronic devices. Also, display panels that may be bent, e.g., at a predetermined angle, from a flat state have been considered.

SUMMARY

Embodiments are directed to an apparatus for manufacturing a display apparatus.

The embodiments may be realized by providing an apparatus for manufacturing a display apparatus, the apparatus including an organic material supply unit; a bagging pump unit that is connected to the organic material supply unit such that the organic material supply unit supplies an organic material to the bagging pump unit; an organic material adjusting unit that is connected to the bagging pump unit such that the bagging pump unit selectively supplies the organic material to the organic material adjusting unit; and a nozzle unit that is connected to the organic material adjusting unit such that the organic material adjusting unit adjusts an amount of the organic material provided to the nozzle unit, the nozzle unit changing the organic material into particles and spraying the particles.

The bagging pump unit may include an organic material pack that changes in volume such that the organic material that is supplied by the organic material supply unit flows into the organic material pack or out of the organic material pack; a housing that surrounds an outer surface of the organic material pack and that stores fluid; and a piston including a portion that is in the housing and that moves inwardly or outwardly relative to the housing to change a volume of the organic material pack.

The apparatus may further include a barrel in which organic material emitted from the nozzle unit is evaporated, a portion of the nozzle unit being in the barrel.

The apparatus may further include a top plate between the barrel and a portion of the nozzle unit, the top plate fixing a position of the nozzle unit; an insulator that surrounds a portion of the top plate; and a plate heater on the top plate.

The top plate may include a first top plate that contacts the barrel; and a second top plate that protrudes from the first top plate and that surrounds the nozzle unit, an outer surface of the second top plate being surrounded by the insulator.

The apparatus may further include a sealing unit on an area between the nozzle unit and the insulator, an area between the insulator and the top plate, or an area between the top plate and the nozzle unit.

The nozzle unit may include a nozzle housing; a nozzle coupled with the nozzle housing, a portion of the nozzle protruding from the nozzle housing; a vibrator that is connected to the nozzle, the vibrator vibrating according to a voltage applied thereto from an outside thereof; a fixing unit on the nozzle, the fixing unit contacting the vibrator; and a temperature measurement unit in the nozzle housing, the temperature measurement unit connecting to a ground voltage portion that is connected to the vibrator.

The nozzle unit may further include a flow meter, the flow meter controlling an amount of air flowing into the nozzle housing based on a temperature measured by the temperature measurement unit.

The flow meter may control the amount of air flowing into the nozzle housing such that the temperature measured by the temperature measurement unit is within a predetermined temperature range.

The power consumption of the vibrator may be controlled such that the power consumption is within a predetermined power range.

A current applied to the vibrator is adjusted such that the power consumption is within the predetermined power range.

If a power consumption is lower than a minimum value of the predetermined power range, an amplitude of the current applied to the vibrator may be increased to be greater than a present value or a frequency of the current is decreased to be lower than a present value such that the power consumption is increased to be within the predetermined power range.

If a power consumption exceeds a maximum value of the predetermined power range, an amplitude of the current applied to the vibrator may be decreased to be lower than a present value or a frequency of the current is increased to be greater than a present value such that the power consumption is decreased to be within the predetermined power range.

A voltage applied to the vibrator may be a unipolar pulsed direct current voltage.

The nozzle may have a stepped structure.

The nozzle unit may further include a nozzle tip at an end of the nozzle, the nozzle tip being larger than the end of the nozzle.

An area between steps of the stepped structure of the nozzle may have a tapered shape.

An angle of the areas having the tapered shape of the nozzle decrease from the nozzle housing to an end of the nozzle.

An angle of the areas having the tapered shape of the nozzle may be an acute angle with respect to a lengthwise direction of the nozzle.

An end of the nozzle may be tapered.

These general and specific embodiments may be implemented by using a system, a method, a computer program, or a combination of the system, the method, and the computer program.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
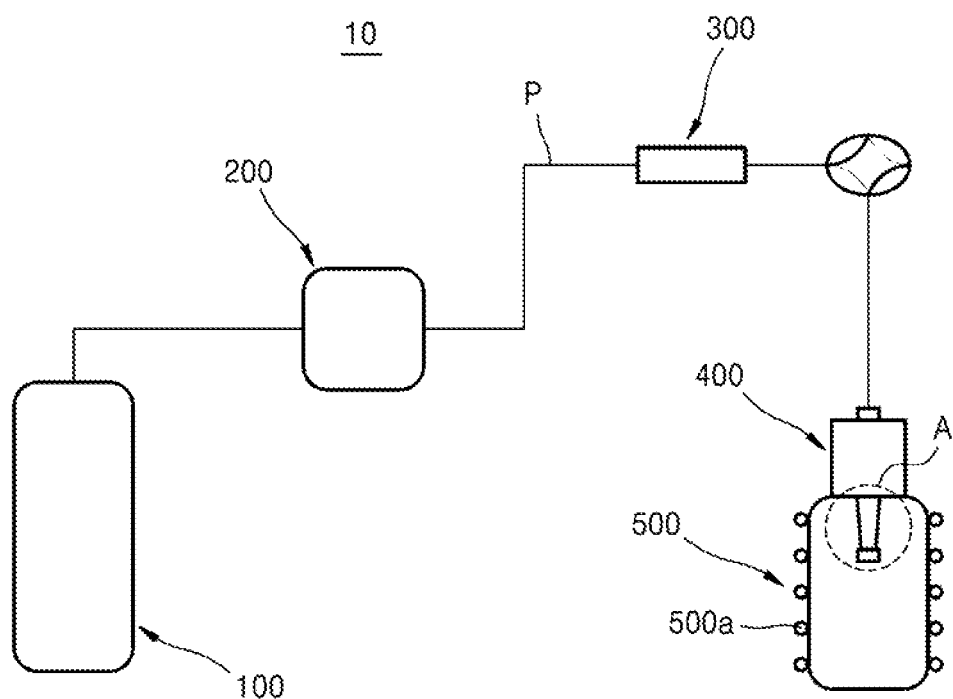
FIG. 1 illustrates a conceptual view of an apparatus for manufacturing a display apparatus, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "includes," "including," "comprises," and/or "comprising" used herein specify the presence of stated features or components, but do not preclude the presence or addition of one or more other features or components.

It will be understood that when a layer, region, or component is referred to as being "on" or "formed on," another layer, region, or component, it can be directly or indirectly formed on the other layer, region, or component. For example, intervening layers, regions, or components may be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
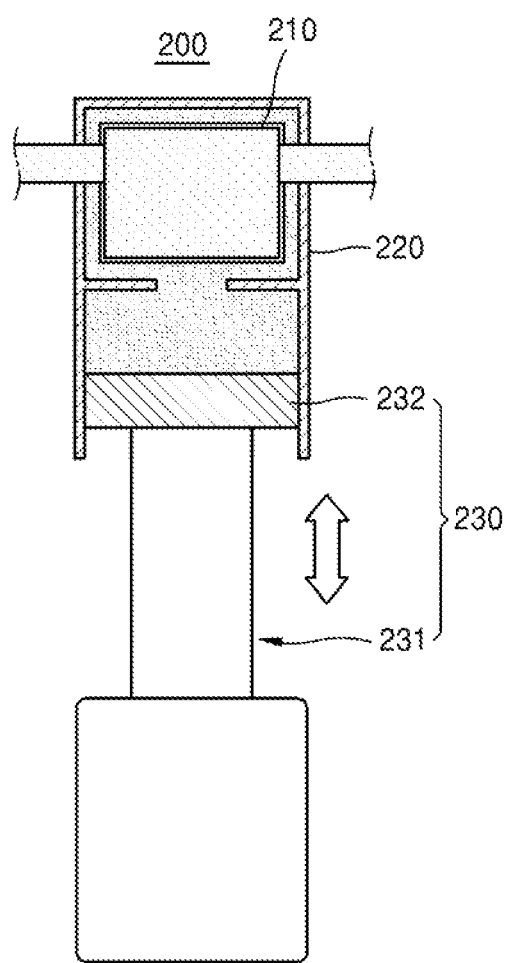
FIG. 2 illustrates a cross-sectional view of a bagging pump unit of FIG. 1.

FIG. 1 illustrates a conceptual view of an apparatus 10 for manufacturing a display apparatus, according to an embodiment. FIG. 2 illustrates a cross-sectional view of a bagging pump unit 200 of FIG. 1.

Figure 5:
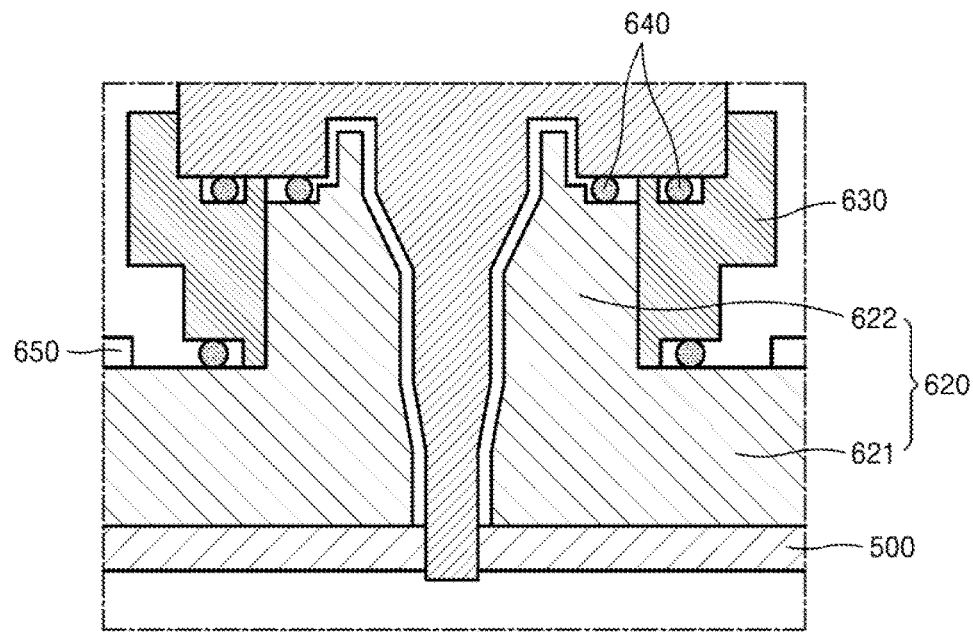
FIG. 5 illustrates an enlarged sectional view of a portion A of FIG. 1.
Figure 6:
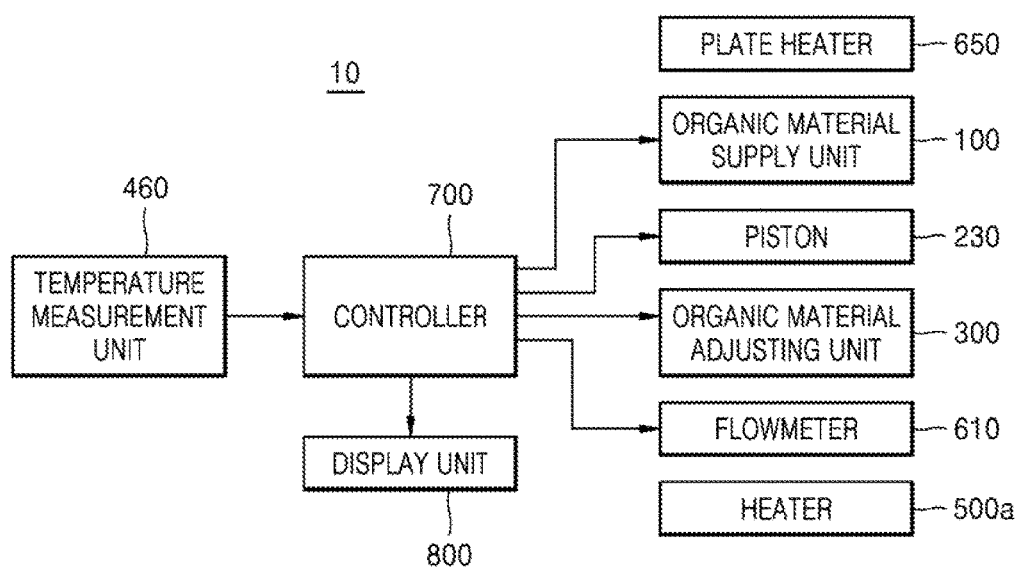
FIG. 6 illustrates a block diagram of a control system of the apparatus of FIG. 1.

Referring to FIGS. 1 and 2, the apparatus 10 may include an organic material supply unit 100, the bagging pump unit 200, an organic material adjusting unit 300, a nozzle unit 400, a barrel 500, a top plate (620, FIG. 5), an insulator (630, FIG. 5), a plate heater (650, FIG. 5), a sealing unit (640, FIG. 5), a flow meter (610, FIG. 3), a controller (700, FIG. 6), and a display unit (800, FIG. 6).

The organic material supply unit 100 may supply an organic material therefrom or to the outside at a constant pressure. In an implementation, the organic material may include a monomer. The organic material supply unit 100 may supply the organic material to the bagging pump unit 200 via a connection pipe P.

The bagging pump unit 200 may include an organic material pack 210 that changes in volume such that the organic material that is received from the organic material supply unit 100 flows in and/or out (e.g., due to a change in pressure). The organic material pack 210 may be formed of a flexible material, e.g., a silicon-containing material, a rubber material, or a synthetic resin.

The bagging pump unit 200 may include a housing 220 that stores a fluid. The housing 220 may surround an outer surface of the organic material pack 210. The housing 220 may have a shape similar to a general cylinder, e.g., may be cylindrical.

The bagging pump unit 200 may include a piston 230 in the housing 220, e.g., at least partially in the housing. When the piston 230 moves upwardly or downwardly inside the housing 220 (e.g., inwardly or outwardly relative to the housing 220), the volume of the organic material pack 210 may change. For example, when the piston 230 departs from or moves away from the organic material pack 210 (e.g., outwardly relative to the housing 220), the piston 230 may reduce a pressure of a fluid inside the housing 220 (e.g., acting on the organic material pack 210). In this case, a pressure of the organic material supplied by the organic material supply unit 100 may be greater than a pressure inside the organic material pack 210. Thus, the organic material may enter the organic material pack 210 (e.g., from the organic material supply unit 100). Alternatively, if the piston 230 approaches or moves toward the organic material pack 210 (e.g., inwardly relative to the housing 220), the piston 230 may apply pressure to the fluid inside the housing 220 (e.g., acting on the organic material pack 210). In this case, the fluid inside the housing 220 may apply pressure to the organic material pack 210. Thus, the organic material in the organic material pack 210 may flow out. For example, in the above-described case, the pressure of the organic material supplied by the organic material supply unit 100 may always be greater than the pressure inside the organic material pack 210. Thus, the organic material may be prevented from flowing from the organic material pack 210 back into to the organic material supply unit 100 (e.g., organic material can only move in one direction, downstream).

The piston 230 may include a piston body unit 231 and a piston sealing unit 232. When the piston body unit 231 moves, the piston sealing unit 232 may seal an area between the piston body unit 231 and the housing 220 to block the fluid in the housing 220 from flowing out.

Therefore, when the organic material is supplied, the bagging pump unit 200 may help prevent the organic material from flowing out according to the motion of the piston 230. In addition, as the organic material is inserted in or provided to the organic material pack 210, the organic material may be indirectly pressed by the fluid, and thus, the organic material may be supplied at a constant pressure for a long time, e.g., constantly.

The organic material adjusting unit 300 may include a liquid mass flow controller. In this case, the organic material adjusting unit 300 may adjust or control an amount of the organic material from the bagging pump unit 200, e.g., such that a uniform amount of the organic material may flow in the connection pipe P.

The nozzle unit 400 may be connected to the connection pipe P and may be inserted into the barrel 500. The nozzle unit 400 may reduce sizes of particles of the organic material that flows through the connection pipe P and may emit the reduced-size particles into the barrel 500. The nozzle unit 400 will be described in greater detail below.

A space may be formed or provided inside the barrel 500. A heater 500a may be provided at or on a surface of the barrel 500 to evaporate the organic material injected from the nozzle unit 400. The organic material that is evaporated by the barrel 500 may be supplied to a processing chamber (not shown) via a guiding pipe (not shown) connected to the processing chamber.

The top plate and the insulator may be between the nozzle unit 400 and the barrel 500. In an implementation, the plate heater may be provided on the top plate. In this case, the plate heater may heat the top plate to help prevent the organic material from being deposited on the top plate.

The sealing unit may be provided in an area between the nozzle unit 400 and the top plate, an area between the insulator and the top plate, and/or an area between the top plate and the nozzle unit 400. For convenience of description, an example in which the sealing unit is provided in all of the area between the nozzle unit 400 and the top plate, the area between the insulator and the top plate, and the area between the top plate and the nozzle unit 400 will be described in detail.

The flow meter may be provided in the nozzle unit 400. For example, the nozzle unit 400 may include an inflow unit (not shown) that emits or supplies air into the nozzle unit 400 and an outflow unit (not shown) through which air inside the nozzle unit 400 flows to the outside. The flow meter may be provided in the inflow unit, may measure an amount of air that passes through the inflow unit, and may adjust or control an inner temperature of the nozzle unit 400 by adjusting (e.g., a size of) an opening of the inflow unit. A detailed description thereof will be provided below.

The controller may be provided at an outside of the apparatus 10 or on an outer surface of the apparatus 10. The controller may control components of the apparatus 10. The controller may be embedded by using various elements. For example, the controller may be a terminal such as a PC, a laptop, or a mobile phone, or a circuit board.

The display unit may be connected to the controller and may display, e.g., to the outside and/or to a user, power consumed by the nozzle unit 400 and a number of vibrations of a vibrator (430, FIG. 3) in the nozzle unit 400.

Hereinafter, the nozzle unit 400 will be described in detail.

Figure 3:
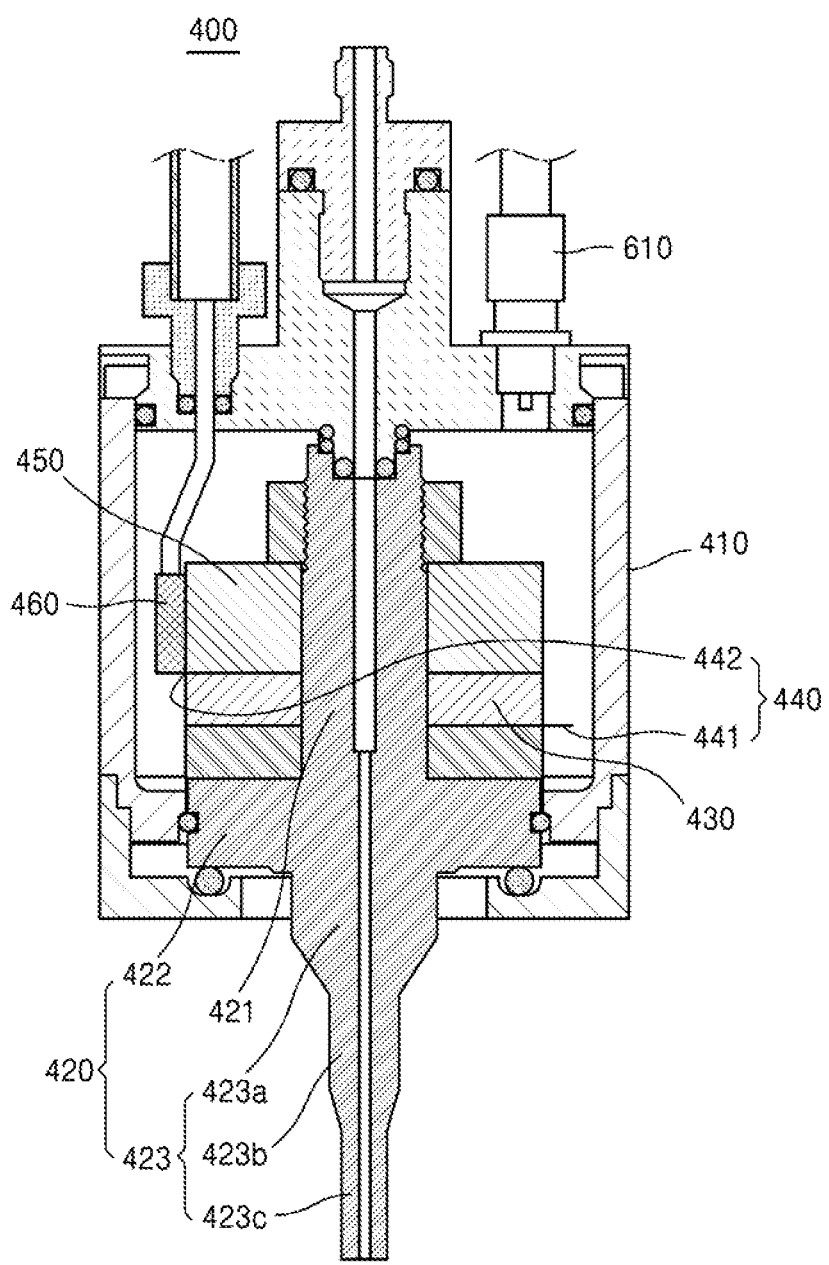
FIG. 3 illustrates a cross-sectional view of a nozzle unit of FIG. 1.
Figure 4A:
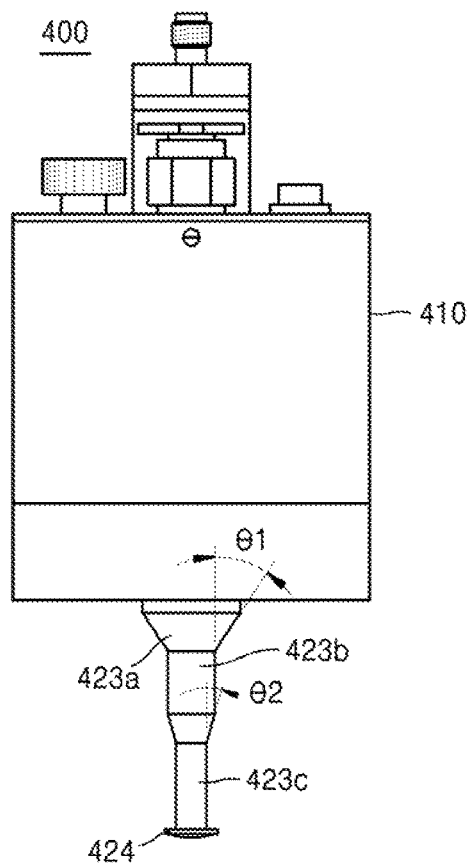
FIGS. 4A and 4B illustrate conceptual views of embodiments of a nozzle of FIG. 3.
Figure 4B:
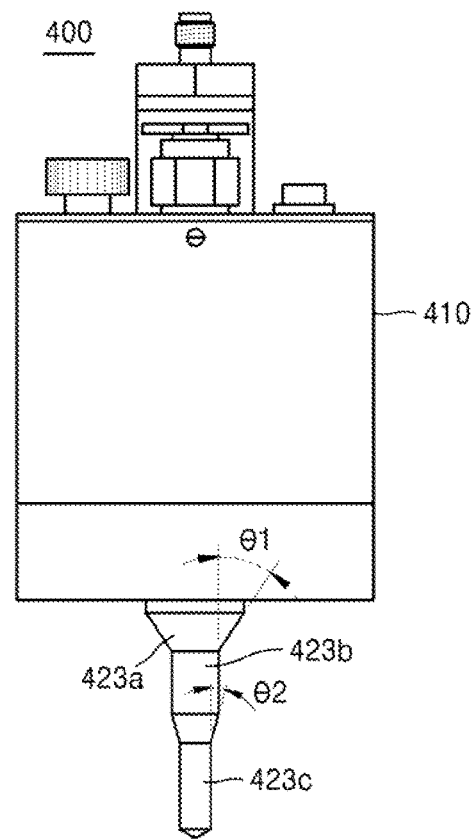

FIG. 3 illustrates a cross-sectional view of the nozzle unit 400 of FIG. 1. FIGS. 4A and 4B illustrate conceptual views of a nozzle 420 of FIG. 3. FIG. 5 illustrates an enlarged sectional view of a portion A of FIG. 1.

Referring to FIGS. 3 to 5, the nozzle unit 400 may include a nozzle housing 410 having an inner space. In an implementation, the nozzle unit 400 may include a nozzle 420 that is coupled to the nozzle housing 410 such that a portion of the nozzle 420 protrudes from the nozzle housing 410.

The nozzle 420 may be provided in, e.g., at least partially in, the nozzle housing 410 and may include a nozzle body unit 421 that is connected to the connection pipe P. Also, the nozzle 420 may include a wing unit 422 that protrudes from the nozzle body unit 421 and that is supported by the nozzle housing 410.

The nozzle 420 may include a protrusion unit 423 that is connected to the nozzle body unit 421 and the wing unit 422 and that protrudes through the nozzle housing 410 to the outside. In an implementation, the protrusion unit 423 may have a roughly stair-step or stepped structure, e.g., may have roughly discontinuously arranged different sized portions. In an implementation, the protrusion unit 423 may include a first protrusion unit 423a, a second protrusion unit 423b, and a third protrusion unit 423c. The first to third protrusion units 423a, 423b, and 423c may have different sizes, e.g., different widths or diameters. For example, the first to third protrusion units 423a, 423b, and 423c may have circular cross-sections, and respective diameters of the first to third protrusion units 423a, 423b, and 423c may decrease in a sequential order.

An area between the first and second protrusion units 423a and 423b and an area between the second and third protrusion units 423b and 423c may be connected in or may have a tapered or inclined shape. The tapered shape may form an acute angle with respect to a lengthwise direction of the nozzle 420. In an implementation, the angle of the tapered shape may decrease from the nozzle housing 410 to an end of the nozzle 420. For example, a first angle θ1 of a tapered shape of the area between the first and second protrusion units 423a and 423b may be greater than a second angle θ2 of a tapered shape of the area between the second and third protrusion units 423b and 423c.

As described above, the protrusion unit 423 may have the roughly stair-step or stepped structure, and it is possible to reduce stress generated in the stair-step or stepped structure when the nozzle 420 vibrates. In addition, the tapered shape of areas corresponding to or separating steps of the stair-step or stepped structure may have an acute angle, and the organic material may be quickly re-evaporated when the nozzle 420 vibrates. Thus, the organic material may not be deposited on the protrusion unit 423.

The nozzle unit 400 may include the vibrator 430 that is connected to the nozzle 420 and that vibrates according to an externally applied voltage. The vibrator 430 may be a piezoelectric component, e.g., a piezoelectric vibrator.

A terminal 440 may be connected to a side of the vibrator 430. For example, the terminal 440 may include a first terminal 441 in a middle of the vibrator 430 and a second terminal 442 at an end of the vibrator 430. For example, the first and second terminals 441 and 442 may have a potential difference therebetween, and the second terminal 442 may generate a ground voltage.

The nozzle unit 400 may include a fixing unit 450 that is fixed to the nozzle body unit 421. When the vibrator 430 vibrates, the fixing unit 450 may fix the vibrator 430 such that the vibrations are transmitted toward the protrusion unit 423.

The nozzle unit 400 may include a temperature measurement unit 460 in the nozzle housing 410. The temperature measurement unit 460 may be connected to the second terminal 442. For example, the temperature measurement unit 460 may measure a temperature of the vibrator 430 and may transmit the temperature to an external controller. The temperature measurement unit 460 may be the same as or similar to, e.g., a thermocouple (TC) sensor.

As described above, the flow meter 610 may be provided in or on the nozzle unit 400. The flow meter 610 may adjust or control an amount of air flowing into the nozzle housing 410. For example, the flow meter 610 may operate depending on whether a temperature measured by the temperature measurement unit 460 is within a predetermined temperature range.

The top plate 620 may be between the barrel 500 and at least a portion of the nozzle unit 400. The top plate 620 may include a first top plate 621 that contacts the barrel 500. The first top plate 621 may have a plate shape and may help prevent the organic material from entering an area between the nozzle unit 400 and the barrel 500.

The top plate 620 may further include a second top plate 622 that protrudes from the first top plate 621. The second top plate 622 may surround the protrusion unit 423.

An external surface of the protrusion unit 423 may be located near the top plate 620 but separated therefrom. For example, the top plate 620 may not interfere with vibrations of the protrusion unit 423. Also, a space formed by or between the external surface of the protrusion unit 423 and an inner surface of the top plate 620 may be curved or tapered according to the tapered shape of the protrusion unit 423, thereby expanding a moving path of the organic material. Therefore, the organic material may be prevented from entering an area between the top plate 620 and the protrusion unit 423.

The insulator 630 may surround an outer surface of the second top plate 622. The insulator 630 may insulate an outer surface of the second top plate 622 so that a temperature of the organic material passing through the protrusion unit 423 does not excessively fluctuate, e.g., does not decrease.

The sealing unit 640 may be provided as described above. For example, the sealing unit 640 may be an O-ring and may seal an area between the nozzle unit 400 and the insulator 630, an area between the insulator 630 and the top plate 620, and/or an area between the top plate 620 and the nozzle unit 400. For example, the sealing unit 640 may help prevent the organic material from entering areas between the components, even when the components are not integrally formed.

The end of the nozzle unit 400 may be formed in various ways, e.g., may have various shapes or forms. For example, the nozzle unit 400 may include a nozzle tip 424 at an end of the protrusion unit 423 (see FIG. 4A). In an implementation, the nozzle tip 424 may have a form of a plate, and a small hole may be formed in a side thereof. In an implementation, a diameter of the nozzle tip 424 may be greater than the diameter of the third protrusion unit 423c. Therefore, a large amount of organic materials may be supplied to the barrel 500 via the nozzle tip 424.

In an implementation, the nozzle unit 400 may not include the nozzle tip 424 at the end of the protrusion unit 423. For example, the end of the nozzle unit 400, i.e., an end of the third protrusion unit 423c, may have a tapered shape. In an implementation, the end of the third protrusion unit 423c have a cone shape. Therefore, a small amount of organic materials may be supplied to the barrel 500 via the end of the third protrusion unit 423c (see FIG. 4B).

Hereinafter, a controlling method and an operation order of the apparatus 10 will be described in detail.

Figure 7:
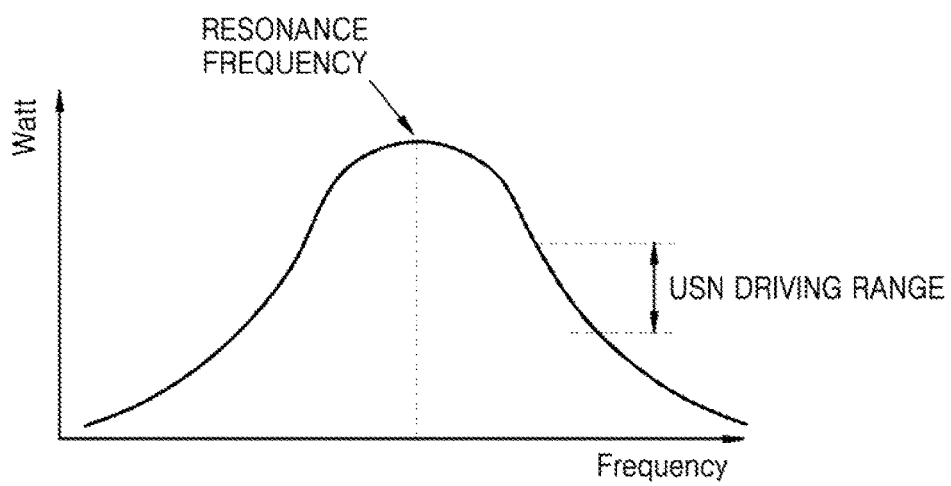
FIG. 7 illustrates a graph of a relationship between power consumed by the nozzle unit of FIG. 1 and the number of vibrations of a nozzle.

FIG. 6 illustrates a block diagram of a control system of the apparatus 10 of FIG. 1. FIG. 7 illustrates a graph of a relationship between power consumed by the nozzle unit 400 of FIG. 1 and a number of vibrations of the nozzle 420.

Figure 8:
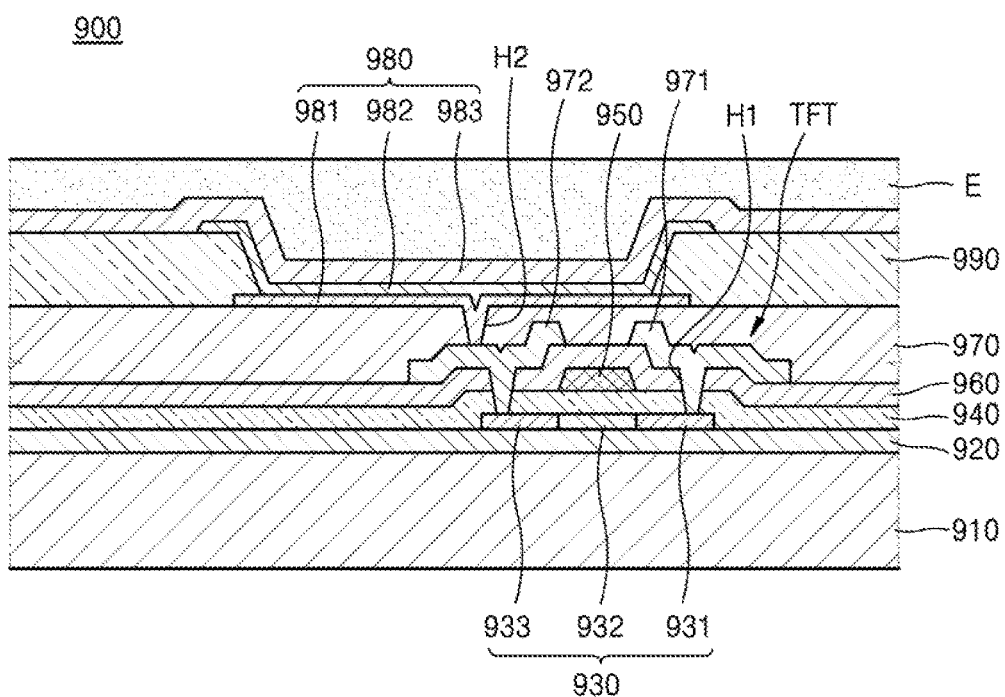
FIG. 8 illustrates a cross-sectional view of a display apparatus manufactured with the apparatus of FIG. 1.

Referring to FIGS. 6 and 7, the apparatus 10 may be used to form an organic layer in a thin film encapsulation layer of a display apparatus (see FIG. 8). Operations of the apparatus 10 are described below. First, a controller 700 may initiate or effect supplying the organic material to the bagging pump unit 200 via the organic material supply unit 100. For example, the controller 700 may control the piston 230 of the bagging pump unit 200 such that a pressure applied by the fluid is decreased. For example, the controller 700 may control an air pressure or fluid pressure applied to the piston 230.

After the organic material is supplied, the controller 700 may control the piston 230 such that the pressure applied to the organic material pack 210 by the fluid is increased. In this case, a volume of the organic material pack 210 may be reduced, and the organic material may be transported or forced from the organic material pack 210 to the organic material adjusting unit 300 through the connection pipe P. Then, the controller 700 may control the organic material adjusting unit 300 such that a uniform amount of organic material passes through the connection pipe P.

While the above-described processes are executed, the controller 700 may operate the nozzle unit 400. For example, the controller 700 may apply a constant voltage to the vibrator 430 via the first and second terminals 441 and 442 of the nozzle unit 400. In an implementation, the voltage may be a unipolar pulsed direct current (DC) voltage. The controller 700 may include a power device that supplies a voltage or current.

The controller 700 may change the voltage (e.g., supplied to the vibrator 430) and at the same time may detect a frequency of the vibrator 430 at a maximum power consumption point of the vibrator 430. The frequency of the vibrator 430 at the maximum power consumption point of the vibrator 430 may be defined as a resonance frequency.

While the above-described processes are executed, the controller 700 may also control a display unit 800 such that power consumption and the number of vibrations of the vibrator 430 are displayed to the outside, e.g., to a user.

When the above-described processes are finished, a relationship between the power consumption and the frequency of the vibrator 430 may have a Gaussian distribution form as shown in FIG. 7. As described above, the maximum power consumption point may be at the resonance frequency of the vibrator 430, and the performance of the nozzle unit 400 may be maximized. However, in such case, although the performance of the nozzle unit 400 may be maximized, the lifespan of the components included in the nozzle unit 400 may be reduced due to the resonance of the nozzle unit 400. Therefore, in order to help prevent the reduction in lifespan, the frequency of the vibrator 430 may be shifted to a frequency other than the resonance frequency. In this case, the controller 700 may adjust the frequency of the vibrator 430 at a right side or a left side of the distribution illustrated in FIG. 7, with respect to the resonance frequency. For convenience of description, an example in which the controller 700 adjusts the frequency of the vibrator 430 at the right side of FIG. 7 with respect to the resonance frequency will be described in detail. For example, the controller 700 may control the vibrator 430 such that the operations of the vibrator 430 are executed in a USN driving range.

For example, in order to execute the above-described processes, the controller 700 may maintain a temperature of the vibrator 430 within a certain temperature range. In this case, the nozzle unit 400 may be heated due to the vibrations of the vibrator 430, operations of the heater 500a of the barrel 500, and/or operations of a plate heater 650. Then, the temperature of the vibrator 430 may be increased, and a resistance and power consumption of the vibrator 430 may be changed. In order to help prevent this, the controller 700 may control the temperature of the vibrator 430 such that the temperature changes only within a certain range. For example, if a temperature measured by the temperature measurement unit 460 were to exceed a maximum value of a predetermined temperature range, the controller 700 could control the flow meter 610 such that the flow meter 610 expands the opening of the inflow unit so that an amount of air inflow is increased. Alternatively, if the temperature measured by the temperature measurement unit 460 were to be lower than a minimum value of the predetermined temperature range, the controller 700 could control the flow meter 610 such that the flow meter 610 reduces the opening of the inflow unit, e.g., such that an amount of air inflow is reduced or air flow is stopped.

When the temperature of the nozzle unit 400 is maintained constant, the controller 700 may control the frequency of the vibrator 430 such that the power consumption of the vibrator 430 is within a predetermined power range. In this case, the controller 700 may control a current applied to the vibrator 430 to control the frequency of the vibrator 430. For example, the controller 700 may control the current applied to the vibrator 430 according to a relationship between the frequency and the power consumption of the vibrator 430.

If the power consumption of the vibrator 430 were to be lower than a minimum value of the predetermined power range, the controller 700 could increase the power consumption by increasing an amplitude of a current applied to the vibrator 430 to be greater than a present value or may decrease the frequency of the vibrator 430 by decreasing a frequency of the current applied to the vibrator 430 to be lower than a present value.

Alternatively, if the power consumption of the vibrator 430 were to exceed a maximum value of the predetermined power range, the controller 700 could decrease the power consumption of the vibrator 430 by decreasing the amplitude of the current applied to the vibrator 430 to be lower than a present value or may increase the frequency of the vibrator 430 by increasing a frequency of the current of the vibrator 430 to be greater than a present value.

Such processes may be sequentially executed. For example, the controller 700 may increase or decrease an amplitude of a current to a predetermined amplitude of the current or increase or decrease a frequency of a current to a predetermined frequency of the current.

While the above-described processes are executed, a particle size of the organic material that flows into the barrel 500 via the nozzle unit 400 may be maintained constant.

Therefore, the apparatus 10 may constantly and uniformly supply the organic material to the barrel 500. Also, the apparatus 10 may increase an operation time by effectively reducing elements that contaminate or decrease the lifespan of the components.

The apparatus 10 may help reduce the leakage of the organic material that could otherwise occur when supplying the organic material. Also, the apparatus 10 may uniformly supply the organic material to the nozzle unit 400, and thus the performance of the nozzle unit 400 may be improved.

FIG. 8 illustrates a cross-sectional view of a display apparatus 900 manufactured with the apparatus 10 of FIG. 1.

Referring to FIG. 8, the display apparatus 900 may include a substrate 910 and a display unit. Also, the display apparatus 900 may include a thin film encapsulation layer E that is formed on the display unit.

The display unit may be formed on the substrate 910. For example, the display unit may include a thin film transistor (TFT), and a passivation layer 970 may be formed to cover the display unit and the TFT. An organic light-emitting diode (OLED) 980 may be formed on the passivation layer 970.

The substrate 910 may include e.g., glass, plastic, or metal, such as stainless steel (SUS) or titanium (Ti). In an implementation, the substrate 910 may be formed of polyimide (PI). Hereinafter, for convenience of description, an example in which the substrate 910 is formed of glass will be described in detail.

A buffer layer 920, formed of an organic compound and/or an inorganic compound, may be additionally formed on the substrate 910. In an implementation, the buffer layer 920 may be formed of, e.g., $SiO_{x(x\geq 1)}$ or $SiN_{x(x\geq 1)}$.

An active layer 930 having a predetermined pattern may be formed on the buffer layer 920, and then, the active layer 930 may be covered by a gate insulating layer 940. The active layer 930 may include a source area 931, a drain area 933, and a channel area 932 between the source and drain areas 931 and 933.

The active layer 930 may include various materials. For example, the active layer 930 may include an inorganic semiconductor material such as amorphous silicon or crystalline silicon. In an implementation, the active layer 930 may include an oxide semiconductor material. In an implementation, the active layer 930 may include an organic semiconductor material. Hereinafter, for convenience of description, an example in which the active layer 930 is formed of amorphous silicon will be described in detail.

The active layer 930 may be formed by forming an amorphous silicon layer on the buffer layer 920, crystallizing the amorphous silicon layer to form a polycrystalline silicon layer, and patterning the polycrystalline silicon layer. In the active layer 930, the source and drain areas 931 and 933 may be doped with impurities according to a type of TFTs, i.e., according to whether the TFT is a driving TFT or a switching TFT.

A gate electrode 950 (that corresponds to the active layer 930) and an interlayer insulating layer 960 (that covers the gate electrode 950) may be formed on the gate insulating layer 940.

A contact hole H1 may be formed in the interlayer insulating layer 960 and the gate insulating layer 940, and then, a source electrode 971 and a drain electrode 972 may be formed on the interlayer insulating layer 960 such that they respectively contact the source and drain areas 931 and 933.

The passivation layer 970 may be formed on the above-described TFT, and a pixel electrode 981 of the OLED 980 may be formed on the passivation layer 970. The pixel electrode 981 may contact the drain electrode 972 of the TFT via a via hole H2 in the passivation layer 970. The passivation layer 970 may be formed as a single layer or layers of an inorganic material and/or an organic material. The passivation layer 970 may be formed as a planarization layer such that an upper surface thereof is flat regardless of curves in a lower layer thereof, or alternatively, curved correspondingly to the curves in the lower layer thereof. In an implementation, the passivation layer 970 may be formed of a transparent insulating material to obtain a resonance effect.

After the pixel electrode 981 is formed on the passivation layer 970, a pixel defining layer 990 may be formed by using an organic material and/or an inorganic material to cover the pixel electrode 981 and the passivation layer 970, and may include an opening so that the pixel electrode 981 is exposed.

In addition, an intermediate layer 982 and an opposite electrode 983 may be formed on the pixel electrode 981.

The pixel electrode 981 may function as an anode electrode, and the opposite electrode 983 may function as a cathode electrode, or vice versa.

The pixel electrode 981 and the opposite electrode 983 may be insulated from each other by the intermediate layer 982. Voltages of different polarities may be applied via or to the intermediate layer 983 so that an organic emission layer (organic EML) emits light.

The intermediate layer 982 may include the organic EML. In an implementation, the intermediate layer 982 includes the organic EML, and may further include at least one selected from a hole injection layer (HIL), a hole transport layer (HTL), an electron transport layer (ETL), and an electron injection layer (EIL).

A unit pixel may include a plurality of sub-pixels that may emit various colors of light. For example, the plurality of sub-pixels may include sub-pixels that emit red, green, and blue light, or sub-pixels that emit red, green, blue, and white light.

The plurality of sub-pixels may include the intermediate layer 982 having organic EMLs that emit various colors of light. For example, the plurality of sub-pixels include the intermediate layer 982 having organic EMLs that emit red, green, and blue light.

The thin film encapsulation layer E may include a plurality of inorganic layers, or an inorganic layer and an organic layer.

The organic layer of the thin film encapsulation layer E may be formed of a polymer and may be a single layer or a stack of layers formed of any one selected from polyethylene terephthalate, polyimide, polycarbonate, epoxy, polyethylene, and polyacrylate. The organic layer may be formed of polyacrylate, e.g., may include a polymerized monomer composition including diacrylate-based monomer and triacrylate-based monomer. The monomer composition may further include monoacrylate-based monomer. In an implementation, the monomer composition may further include a suitable photo initiator, e.g., trimethyl benzoyl diphenyl phosphine oxide (TPO).

The inorganic layer of the thin film encapsulation layer E may be a single layer or a stack of layers including a metal oxide or a metal nitride. For example, the inorganic layer may include any one selected from $SiN_x$, $Al_2O_3$, $SiO_2$, and $TiO_2$.

The top layer of the thin film encapsulation layer E that is exposed to the outside may be formed of an inorganic layer in order to help prevent intrusion of moisture into the OLED 980.

In an implementation, the thin film encapsulation layer E may include at least one sandwich structure in which at least one organic layer is inserted between at least two inorganic layers. In an implementation, the thin film encapsulation layer E may include at least one sandwich structure in which at least one inorganic layer is inserted between at least two organic layers. In an implementation, the thin film encapsulation layer E may include a sandwich structure in which at least one organic layer is inserted between at least two inorganic layers and a sandwich structure in which at least one inorganic layer is inserted between at least two organic layers.

In an implementation, the thin film encapsulation layer E may include a first inorganic layer, a first organic layer, and a second inorganic layer sequentially formed from the top portion of the OLED 980.

In an implementation, the thin film encapsulation layer E may include a first inorganic layer, a first organic layer, a second inorganic layer, a second organic layer, and a third inorganic layer sequentially formed from the top portion of the OLED 980.

In an implementation, the thin film encapsulation layer E may include a first inorganic layer, a first organic layer, a second inorganic layer, a second organic layer, a third inorganic layer, a third organic layer, and a fourth inorganic layer sequentially formed from the top portion of the OLED 980.

A halogenated metal layer including lithium fluoride (LiF) may be additionally included between the OLED 980 and the first inorganic layer. The halogenated metal layer may help prevent the OLED 980 from being damaged during the formation of the first inorganic layer (by a sputtering method or a plasma deposition method).

The first organic layer may be smaller than the second inorganic layer and the second organic layer may be smaller than the third inorganic layer.

When manufacturing the thin film encapsulation layer E as described above, the organic layer may be manufactured by using the apparatus 10. For example, an organic layer may be manufactured by uniformly spreading the organic material, and thus, a uniform organic layer may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing a display apparatus, the apparatus comprising:
   an organic material supply unit;
   a bagging pump unit that is connected to the organic material supply unit such that the organic material supply unit supplies an organic material to the bagging pump unit;
   an organic material adjusting unit that is connected to the bagging pump unit such that the bagging pump unit selectively supplies the organic material to the organic material adjusting unit;
   a nozzle unit that is connected to the organic material adjusting unit such that the organic material adjusting unit adjusts an amount of the organic material provided to the nozzle unit, the nozzle unit including a nozzle and changing the organic material into particles and spraying the particles; and a top plate surrounding the nozzle, a sealing unit being positioned directly between the top plate and the nozzle, wherein the nozzle has a stepped structure including at least three steps, areas between steps of the stepped structure of the nozzle having a tapered shape and being surrounded by the top plate, and wherein a taper angle of the area between steps proximate to a nozzle housing is greater than the taper angle of the area between steps proximate to an outer end of the nozzle.

2. The apparatus as claimed in claim 1, wherein the bagging pump unit includes:

an organic material pack that changes in volume such that the organic material that is supplied by the organic material supply unit flows into the organic material pack or out of the organic material pack;

a housing that surrounds an outer surface of the organic material pack, a space between the housing and the outer surface of the organic material pack being filled with fluid; and a piston including a portion that is in the housing and that moves inwardly or outwardly relative to the housing to change a volume of the organic material pack.

3. The apparatus as claimed in claim 1, further comprising a barrel in which organic material emitted from the nozzle unit is evaporated, a portion of the nozzle unit being in the barrel.

4. The apparatus as claimed in claim 3, further comprising:

the top plate between the barrel and a portion of the nozzle unit, the top plate fixing a position of the nozzle unit, and an empty space being defined between an outer surface of the nozzle and the top plate;

an insulator that surrounds a portion of the top plate, the portion of the top plate being between the outer surface of the nozzle and the insulator; and a plate heater on the top plate.

5. The apparatus as claimed in claim 4, wherein the top plate includes:

a first top plate that contacts the barrel; and a second top plate that protrudes from the first top plate and that surrounds the nozzle unit, an outer surface of the second top plate being surrounded by the insulator.

6. The apparatus as claimed in claim 4, wherein the sealing unit seals the empty space between the outer surface of the nozzle and the top plate and is further directly between the nozzle and the insulator.

7. The apparatus as claimed in claim 1, wherein the nozzle unit includes:

the nozzle housing;

the nozzle coupled with the nozzle housing, a portion of the nozzle protruding from the nozzle housing;

a vibrator that is connected to the nozzle, the vibrator vibrating according to a voltage applied thereto from an outside thereof;

a fixing unit on the nozzle, the fixing unit contacting the vibrator; and a temperature measurement unit in the nozzle housing, the temperature measurement unit connecting to a ground voltage portion that is connected to the vibrator.

8. The apparatus as claimed in claim 7, wherein the nozzle unit further includes a flow meter, the flow meter controlling an amount of air flowing into the nozzle housing based on a temperature measured by the temperature measurement unit.

9. The apparatus as claimed in claim 8, wherein the flow meter controls the amount of air flowing into the nozzle housing such that the temperature measured by the temperature measurement unit is within a predetermined temperature range.

10. The apparatus as claimed in claim 7, wherein power consumption of the vibrator is controlled such that the power consumption is within a predetermined power range.

11. The apparatus as claimed in claim 10, wherein a current applied to the vibrator is adjusted such that the power consumption is within the predetermined power range.

12. The apparatus as claimed in claim 11, wherein, if the power consumption is lower than a minimum value of the predetermined power range, an amplitude of the current applied to the vibrator is increased to be greater than a present value or a frequency of the current is decreased to be lower than a present value such that the power consumption is increased to be within the predetermined power range.

13. The apparatus as claimed in claim 11, wherein, if the power consumption exceeds a maximum value of the predetermined power range, an amplitude of the current applied to the vibrator is decreased to be lower than a present value or a frequency of the current is increased to be greater than a present value such that the power consumption is decreased to be within the predetermined power range.

14. The apparatus as claimed in claim 7, wherein a voltage applied to the vibrator is a unipolar pulsed direct current voltage.

15. The apparatus as claimed in claim 7, wherein the nozzle unit further includes a nozzle tip at the outer end of the nozzle, the nozzle tip being larger than the outer end of the nozzle.

16. The apparatus as claimed in claim 7, wherein the taper angle is an acute angle with respect to a lengthwise direction of the nozzle.

17. The apparatus as claimed in claim 7, wherein the outer end of the nozzle is tapered.

18. The apparatus as claimed in claim 1, wherein the nozzle unit includes a vibrator in contact with an outer surface of the nozzle, the vibrator and nozzle being inside the same nozzle housing.

19. The apparatus as claimed in claim 18, further comprising a temperature measurement unit inside the nozzle housing, a fixing unit being positioned between the outer surface of the nozzle and the temperature measurement unit.

20. An apparatus for manufacturing a display apparatus, the apparatus comprising:

an organic material supply unit;

a bagging pump unit that is connected to the organic material supply unit such that the organic material supply unit supplies an organic material to the bagging pump unit;

an organic material adjusting unit that is connected to the bagging pump unit such that the bagging pump unit selectively supplies the organic material to the organic material adjusting unit; and a nozzle unit that is connected to the organic material adjusting unit such that the organic material adjusting unit adjusts an amount of the organic material provided to the nozzle unit, the nozzle unit including a nozzle and spraying the organic material, wherein the nozzle includes:

a nozzle body in a nozzle housing, a wing protruding from the nozzle body and supported by the nozzle housing, a first protrusion protruding from the wing toward an outside of the nozzle housing, a second protrusion connected with the first protrusion, and a third protrusion connected with the second protrusion, wherein the first protrusion, the second protrusion, and the third protrusion have circular cross-sections, and respective diameters of the first protrusion, the second protrusion, and the third protrusion decrease in a sequential order, and wherein an area between the first and second protrusion and an area between the second and third protrusion have a tapered shape.

\* \* \* \* \*